United States Patent [19]

Swapp

[11] Patent Number: 4,745,310
[45] Date of Patent: May 17, 1988

[54] PROGRAMMABLE DELAY CIRCUIT

[75] Inventor: Mavin C. Swapp, Mesa, Ariz.

[73] Assignee: Motorola, Inc., Schaumburg, Ill.

[21] Appl. No.: 125,755

[22] Filed: Nov. 23, 1987

Related U.S. Application Data

[63] Continuation of Ser. No. 892,513, Aug. 4, 1986, abandoned.

[51] Int. Cl.$^4$ .................... H03K 5/13; H03K 5/159
[52] U.S. Cl. .................................. 307/603; 307/597; 328/55
[58] Field of Search ............... 307/603, 595, 597, 592; 328/55

[56] References Cited

U.S. PATENT DOCUMENTS

| | | | |
|---|---|---|---|
| 4,234,850 | 11/1980 | Collins | 307/597 |
| 4,458,165 | 7/1984 | Jackson | 307/603 |
| 4,504,749 | 3/1985 | Yoshida | 307/603 |

Primary Examiner—Stanley D. Miller
Assistant Examiner—Richard Roseen
Attorney, Agent, or Firm—William E. Koch

[57] ABSTRACT

A monolithically integrated delay circuit is provided that comprises a gate coupled for receiving a digital input signal. The output of the gate is capacitively loaded whereby the output signal has a sloping downward transition. A line receiver has a first input coupled to said gate and a second input coupled for receiving an analog signal for comparing the analog signal with the output of the gate and for providing a digital output signal that is delayed with respect to the digital input signal.

18 Claims, 5 Drawing Sheets

PROGRAMMABLE DELAY CIRCUIT

This application is a continuation of application Ser. No. 892,513, filed Aug. 4, 1986, now abandoned.

FIELD OF THE INVENTION

This invention relates in general to a programmable delay circuit and, more particularly, to a circuit that provides an accurate delay of a digital input signal that has a large adjustable range wherein the delay may be programmed quickly.

BACKGROUND OF THE INVENTION

Delay circuits for delaying a signal for a desired time period are well known. Most of these known delay circuits typically may be used in a variety of applications. One such application is the testing of integrated circuits. A crucial step in the manufacturing of integrated circuits is the testing of those circuits after device fabrication. As with each of the steps involved in integrated circuit manufacture, it is advantageous to perform this testing with as little cost as possible. Therefore, high speed, automated integrated circuit testers are necessary.

As integrated circuits become more complex and require more pins for interconnection to circuit boards and the like, the apparatus necessary for testing the integrated circuits becomes much more complex. Current DC testers have multiple force and measure units, each applying a predetermined forcing condition of voltage and/or current to a pin of a test head and measuring the response thereto. Each pin of the test head is connected to a pin of the integrated circuit under test. Typically, a minicomputer contains the testing and measuring routines and is responsible for managing the testing process.

Current AC testers provide test signals from the tester to the integrated circuit under test that are delayed for providing setup and hold time, timing edges, etc. The delay circuit must be accurate, have a large adjustable range and be able to change delays in a few nanoseconds. Portions of previously known delay circuits were on chip but required external comparators and ramp circuits and did not provide the desired accuracy, range and quick change rate required for efficient high speed testing.

Thus, what is needed is an accurate on-chip delay circuit that has a large adjustable range.

SUMMARY OF THE INVENTION

Accordingly, it is an object of the present invention to provide an improved on-chip delay circuit.

Another object of the present invention is to provide an on-chip delay circuit that compares digital and analog input signals for providing a delayed output signal.

Yet another object of the present invention is to provide an on-chip programmable delay circuit that has a large range from which a delay may be selected.

A further object of the present invention is to provide an on-chip programmable delay circuit that has small selectable incremental delays.

Still a further object of the present invention is to provide an on-chip programmable delay circuit in which the time of the delay may be quickly changed.

In carrying out the above and other objects of the invention in one form, there is provided a monolithically integrated delay circuit including a gate coupled for receiving a digital input signal. The output of the gate is capacitively loaded whereby the output signal has a sloping downward transition. A line receiver has a first input coupled to said gate and a second input coupled for receiving an analog signal for comparing the analog signal with the output of the gate and for providing a digital output signal that is delayed with respect to the digital input signal.

The above and other objects, features, and advantages of the present invention will be better understood from the following detailed description taken in conjunction with the accompanying drawings.

DETAILED DESCRIPTION OF THE INVENTION

Figure 1:
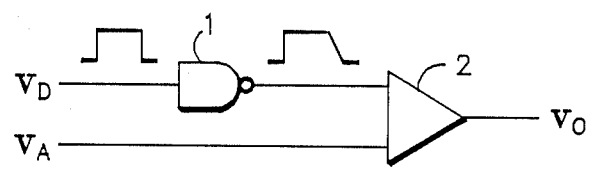
FIG. 1 is a block diagram of the preferred embodiment of the present invention.
Figure 2:
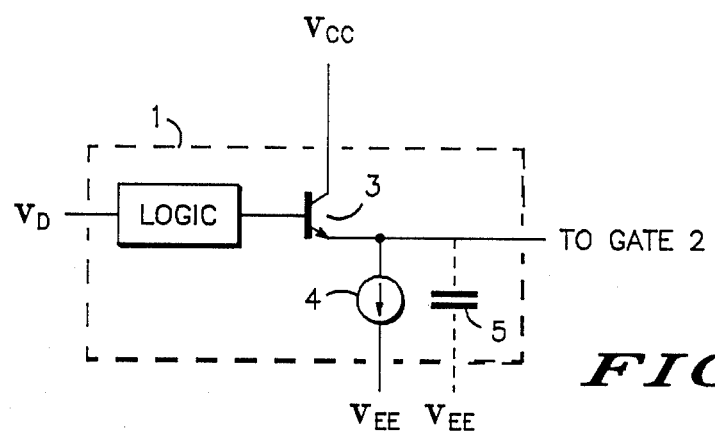
FIG. 2 is a schematic of one gate within the preferred embodiment.
Figure 3:
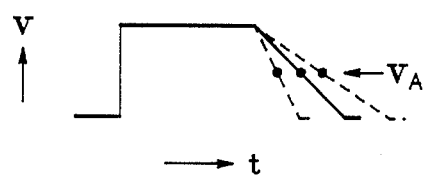
FIG. 3 is a waveform of the output of the gate of FIG. 2.

FIG. 1 illustrates in block form the programmable delay circuit according to the present invention which is suitable to be fabricated in monolithic integrated circuit form. NAND gate 1 has an input coupled for receiving digital input signal $V_D$ and an output connected to one input of line receiver 2. Line receiver 2 has another input coupled for receiving analog input signal $V_A$ and an output for providing delayed signal $V_D$. Gate 1 may actually be any type of gate such as an AND gate, OR gate or a NOR gate. FIG. 2 illustrates the configuration of the output transistor of gate 1. Transistor 3 has a collector coupled for receiving voltage $V_{CC}$, a base coupled for receiving digital input signal $V_D$ through the output of the logic in gate 1, and an emitter coupled for providing the input to gate 2 and to voltage $V_{EE}$ by both current source 4 and parasitic capacitance 5. The shape of the waveform of digital input signal $V_D$ and the output of gate 1 are shown in FIG. 1. The output of gate 1 has a sloping negative going transition due to parasitic capacitance of the metal connecting runs on the integrated circuit. This capacitance may be varied by shortening or lengthening the metal run for providing a fast rise time and a slow fall time so that the outputs may be compared with analog signal $V_A$. A shallower slope would give a greater delay range and a steeper slope would give a smaller delay range (see FIG. 3). The length of the delay is a function of analog signal $V_A$. Additional embodiments are illustrated included in the circuits in FIGS. 6 and 7 and will be discussed in greater detail hereinafter.

Figure 4:
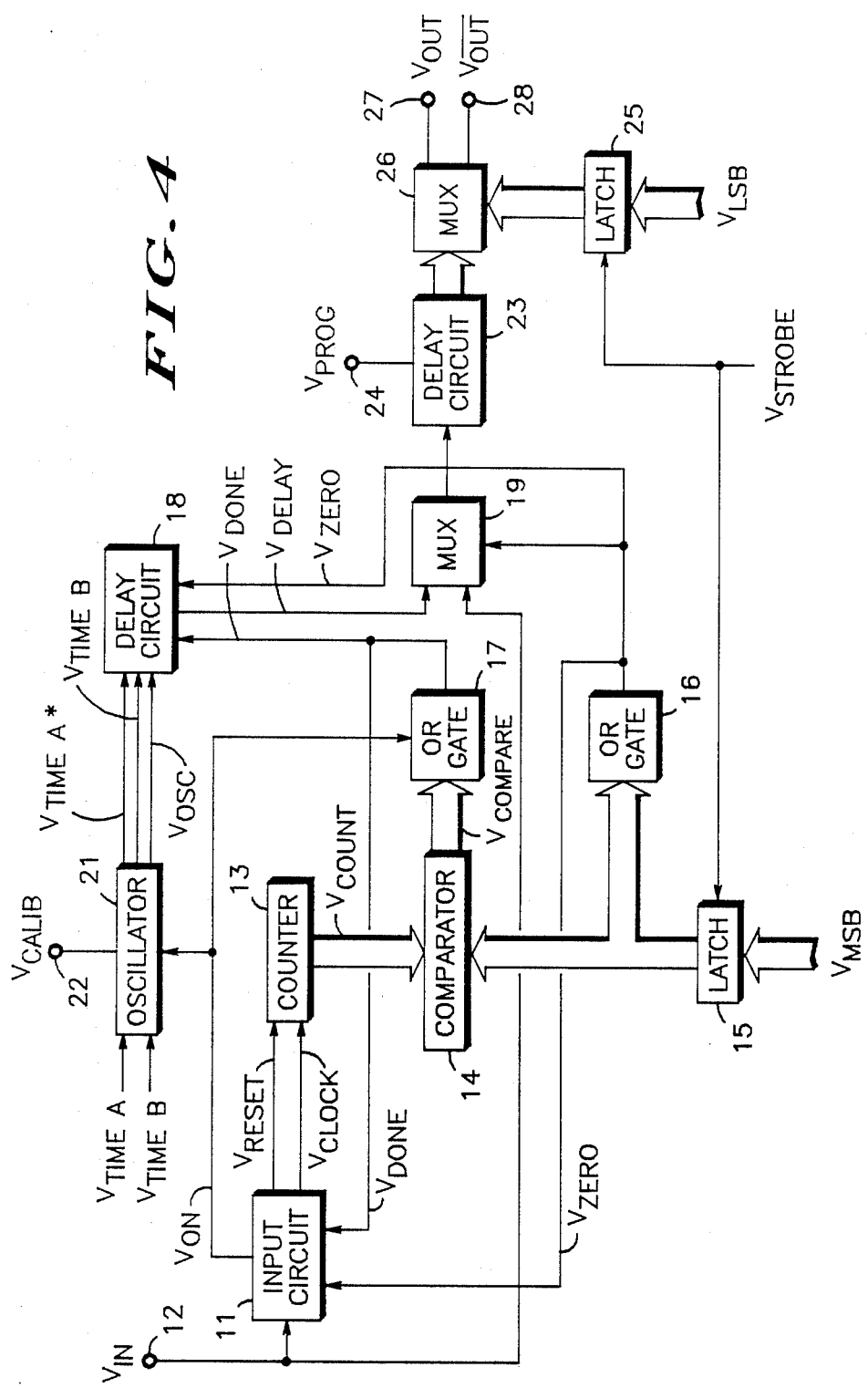
FIG. 4 is a block diagram of an integrated circuit test system that includes the preferred embodiment.

FIG. 4 illustrates in block form another embodiment of the programmable delay circuit which is suitable to be fabricated in monolithic integrated circuit form. Input circuit 11 is connected to input terminal 12 for receiving digital input signal $V_{IN}$. Input circuit 11 is further connected to counter 13 for providing thereto resetting signal $V_{RESET}$ and clocking signal $V_{CLOCK}$, respectively. Counter 13 is connected to comparator 14 for providing a plurality of timing signals $V_{COUNT}$ representing a period of time. Latch 15 is coupled to receive programming signals $V_{MSB}$ representing the most significant bit and is connected to comparator 14 and OR gate 16 for providing latched programming signals $V_{MSB}$ thereto. Comparator 14 compares timing signals $V_{COUNT}$ and latched programming signals $V_{MSB}$ and provides to OR gate 17 a plurality of comparator output signals $V_{COMPARE}$ representing a period of time from the change in state of input signal $V_{IN}$ till the time when signal $V_{COUNT}$ equals latched signal $V_{MSB}$. OR gate 17 further has an input connected to input circuit 11 for receiving enable signal $V_{ON}$. The output of OR gate 17 is connected to input circuit 11 and to delay circuit 18 for providing clocking signal $V_{DONE}$ thereto that indicates when counter 13 has completed counting. The output of OR gate 16 is connected to input circuit 11, multiplexer 19, and delay circuit 18 for providing signal $V_{ZERO}$ thereto that indicates whether specific further delay increments are desired.

Oscillator 21 has inputs connected to input circuit 11 for receiving signal $V_{ON}$ for enabling oscillator 21, to terminal 22 for receiving calibration analog signal $V_{CALIB}$, and coupled for receiving input timing calibration signals $V_{Time\,A}$ and $V_{Time\,B}$ for calibrating the timing of oscillator 21. Delay circuit 18 is connected to oscillator 21 for receiving oscillator output signal $V_{OSC}$, and input timing calibration signals $V_{Time\,A^*}$ and $V_{Time\,B}$, and is connected to the output of OR gate 16 for receiving signal $V_{ZERO}$. Multiplexer 19 has inputs connected to input terminal 12 for receiving input signal $V_{IN}$ and to delay circuit 18 for receiving signal $V_{DELAY}$. Signal $V_{DELAY}$ provides delays greater than 10 nanoseconds, as explained further hereinafter. Multiplexer 19 provides either of signals $V_{DELAY}$ or $V_{IN}$ to delay circuit 23 depending on the state of signal $V_{ZERO}$. Delay circuit 23 is connected to terminal 24 for receiving analog signal $V_{PROG}$. Latch 25 is coupled for receiving programming signal $V_{LSB}$ representing the least significant bit. Latch 15 and latch 25 are coupled for receiving strobe signal $V_{STROBE}$ for latching signals $V_{MSB}$ and $V_{LSB}$, respectively. Multiplexer 26 is connected to latch 25 for receiving latched programming signals $V_{LSB}$ and to delay circuit 23 for receiving a plurality of outputs therefrom. Multiplexer 26 is connected to output terminals 27 and 28 for providing signals $V_{OUT}$ and $\overline{V_{OUT}}$, respectively. The output of multiplexer 26 is selected from one of the plurality of signals from delay circuit 23 in accordance with the state of latched programming signals $V_{LSB}$.

The delay between input signal $V_{IN}$ and output signal $V_{OUT}$ is determined by the number of flip-flops, gates, etc., within the circuit. For the embodiment specifically illustrated in FIG. 4, an input signal may be delayed in 20 picosecond increments for the range of 0.0 nanoseconds to 640 nanoseconds plus the minimum circuit propagation time. The circuit may be used to delay a signal for a variety of applications, but is specifically usable to delay the output signal of an automated integrated circuit tester. For example, the circuit is responsive to a sequenced test signal from the tester for providing a delayed signal to the test head. The test head comprises a plurality of pins, each coupled to a pin of the integrated circuit being tested.

Delay circuit 23 provides a delay of 1.25 nanoseconds or less. Multiplexer 19 forwards input signal $V_{IN}$ to delay circuit 23 when specified by instructions provided by programming signals $V_{MSB}$ through OR gate 16. Multiplexer 26 determines the incremental delay up to 10 nanoseconds in 1.25 nanosecond steps in accordance with instructions received from programming signals $V_{LSB}$ through latch 25. Input circuit 11, counter 13, comparator 14, OR gate 17, oscillator 21, and delay circuit 18 provides for additional delays in 10 nanosecond steps up to 640 nanoseconds, which may be summed with the delay of less than 10 nanoseconds provided by delay circuit 23. The operation of each of the elements of the delay circuit will be explained in greater detail in reference to FIGS. 5, 6, and 7.

Figure 5:
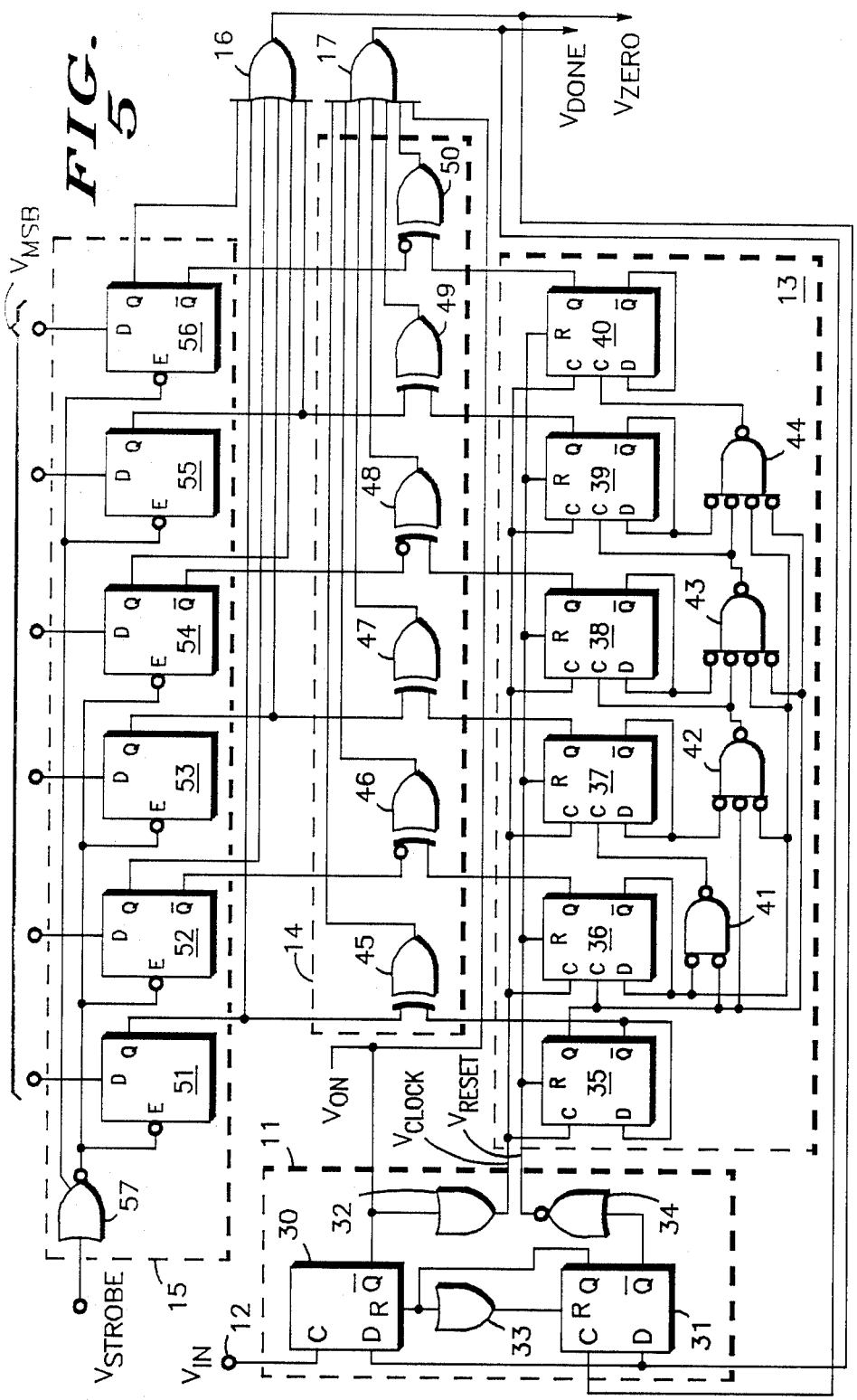
FIG. 5 is a more detailed block diagram of a first portion of FIG. 1 including an input circuit, counter, comparator, two OR gates, and one latch.

Referring to FIG. 5, input circuit 11, counter 13, comparator 14, latch 15, and OR gates 16 and 17 are illustrated in block form. Input circuit 11 includes flip-flops 30 and 31 having their D inputs coupled to the output of OR gate 16 for receiving signal $V_{ZERO}$. The clock input of flip-flop 30 is connected to input terminal 12 for receiving input signal $V_{IN}$. The clock input of flip-flop 31 is connected to the output of OR gate 17 for receiving clock signal $V_{DONE}$. Output Q of flip-flop 30 is connected to an input of OR gate 17 for providing signal $V_{ON}$ and to the input of OR gate 32 for providing clock signal $V_{CLOCK}$ to counter 13. Output Q of flip-flop 31 is connected to the reset input of flip-flop 31 by OR gate 33 and to the reset input of flip-flop 30. Output Q of flip-flop 31 is coupled to counter 13 by NOR gate 34 for providing reset signal $V_{RESET}$.

Counter 13 includes flip-flops 35–40 having their reset and clock inputs connected to input circuit 11 for receiving reset signal $V_{RESET}$ and clock signal $V_{CLOCK}$, respectively. Flip-flop 35 has its D input and Q output connected to an input of exclusive OR gate 45 and its output Q connected to a clock input of flip-flop 36 and to an input of each of NAND gates 41–44. The date input D and output Q of flip-flops 36–39 are each connected to an input of NAND gates 41–44, respectively. The outputs of NAND gates 41–44 are each connected to clock inputs of flip-flops 37–40, respectively. Outputs Q of each of flip-flops 36–40 are connected to an input of exclusive OR gates 46–50, respectively. The output of NAND gates 42 and 43 are further connected to an input of NAND gates 43 and 44, respectively.

Latch 15 includes flip-flops 51–56, each having a data input coupled for receiving one each of programming signals $V_{MSB}$, respectively. Flip-flops 51–54 have enable inputs connected to an inverting output of NOR gate 57 and flip-flops 55–56 have enable inputs connected to a non-inverting output of NOR gate 57. Flip-flops 51, 53, and 55 have output Q connected to an input of exclusive OR gates 45, 47, and 49, respectively, and each to a separate input of OR gate 16. Flip-flops 52, 54, and 56 have output Q connected to a separate input of OR gate 16 and output Q connected to an inverting input of exclusive OR gates 46, 48, and 50. NOR gate 57 is coupled to receive strobe signal $V_{STROBE}$.

Programming signal $V_{MSB}$ is provided to OR gate 16 when incremental 10 nanosecond delays are desired, which results in signal $V_{ZERO}$ being provided to the "D" input of flip-flops 30 and 31. The Q output of flip-flop 30 clocks flip-flops 35–40 of counter 13 by signal $V_{CLOCK}$. Counter 13 counts in a manner known to those skilled in the art, providing outputs $V_{COUNT}$ from each flip-flop 35–40 to inputs of exclusive OR gates 45–50 of comparator 14. These outputs are compared in comparator 14 with latched programming signals $V_{MSB}$, providing an output from each of exclusive OR gates 45-50 to OR gate 17; thereby providing signal $V_{DONE}$ representing when signals $V_{MSB}$ and $V_{COUNT}$ are the same.

Figure 6:
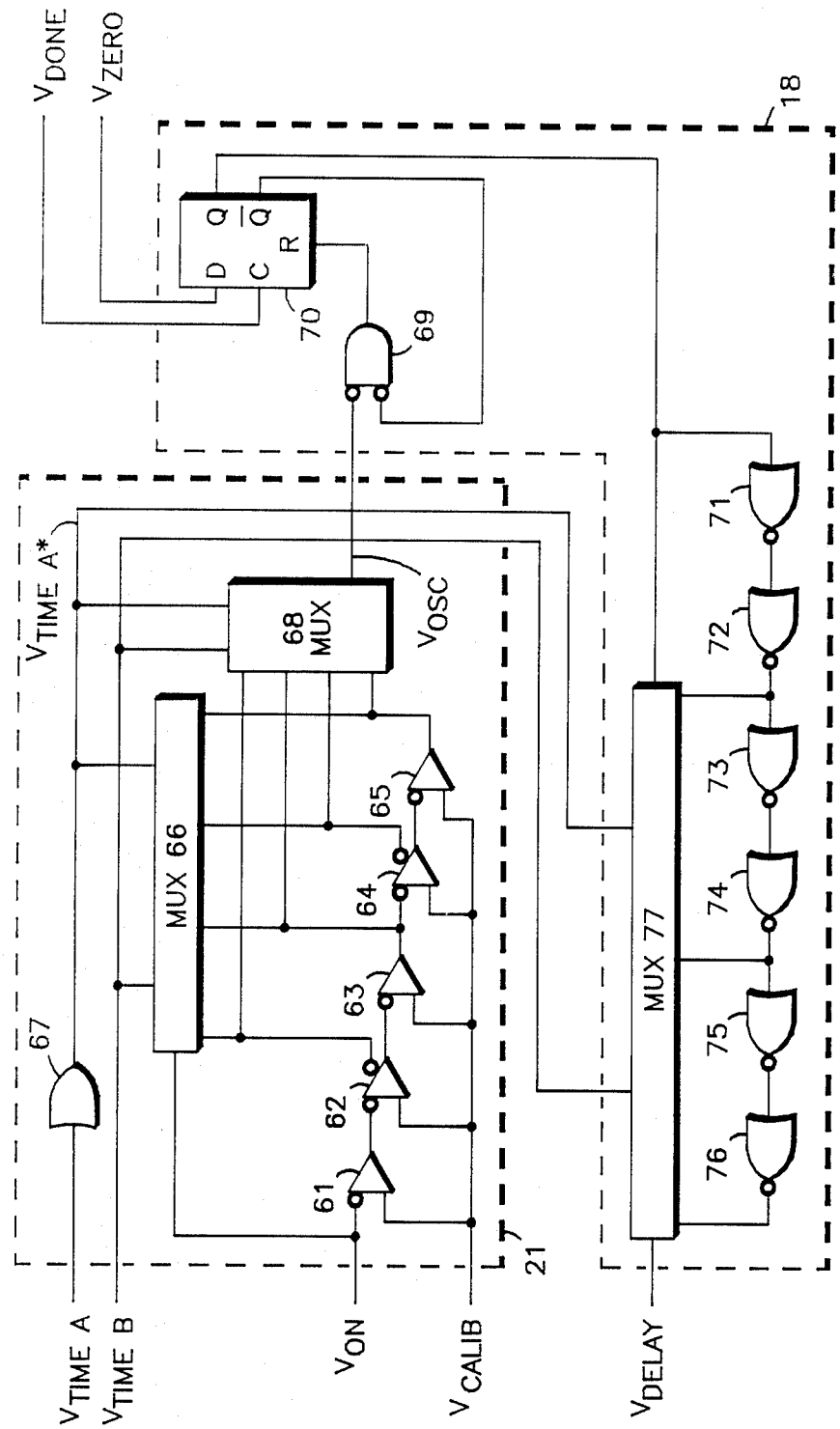
FIG. 6 is a more detailed block diagram of a second portion of FIG. 1 including an oscillator and one delay circuit.

Referring to FIG. 6, oscillator 21 includes gates 61-65, each having an input coupled for receiving analog signal $V_{CALIB}$. Gate 61 has an inverting input connected to multiplexer 66 and to input circuit 11 for receiving signal $V_{ON}$, and gates 62-65 have an inverting input connected to the output of the preceding gate. The inverting outputs of gates 62 and 64 and the non-inverting outputs of gates 63 and 65 are connected to multiplexers 66 and 68. Multiplexers 66 and 68 have an input coupled to receive input timing calibration signal $V_{TIME\ A^*}$ through OR gate 67 and input timing calibration signal $V_{TIME\ B}$. Multiplexer 66 provides signal $V_{ON}$ to one of the outputs to multiplexer 68 depending on the state of signals $V_{TIME}A^*$ and $V_{TIME\ B}$. Multiplexer 68 provides one of the inputs from multiplexer 66 as output $V_{OSC}$ depending on signals $V_{TIME\ A^*}$ and $V_{TIME\ B}$.

AND gate 69 has one inverting input connected to output $V_{OSC}$ of multiplexer 68 and another inverting input connected to output Q of flip-flop 70. Flip-flop 70 has its data input and clock input coupled for receiving signals $V_{ZERO}$ and $V_{DONE}$, respectively. Flip-flop 70 further has its reset input connected to the output of AND gate 69 and its Q output connected to the input of NOR gate 71 and to multiplexer 77. NOR gates 71-75 have their outputs connected to the inputs of the following NOR gates in series and the outputs of gates 72, 74, and 76 are connected to multiplexer 77. Multiplexer 77 is coupled to receive input timing calibration signals $V_{TIME\ A^*}$ and $V_{TIME\ B}$. The output of multiplexer 77 is signal $V_{DELAY}$. Multiplexer 77 provides one of the inputs from flip-flip 70 or gates 72, 74, 76 as signal $V_{DELAY}$ depending on the state of signals $V_{TIME\ A^*}$ and $V_{TIME\ B}$.

Gates 61-65 are responsive to signal $V_{ON}$ and calibration analog signal $V_{CALIB}$, providing output signals to multiplexer 66 and multiplexer 68. These output signals represent incremental delays due to gates 61-65. Signal $V_{OSC}$ from multiplexer is determined by timing signals $V_{TIME\ A^*}$ and $V_{TIME\ B}$. Flip-flop 70 provides signals to multiplexer 77 in response to signals $V_{OSC}$, $V_{DONE}$ and $V_{ZERO}$. These signals to multiplexer represent incremental delays due to NOR gates 71-76. The output signal $V_{DELAY}$ from multiplexer 77 is determined by timing signals $V_{TIME}A^*$ and $V_{TIME\ B}$.

Figure 7:
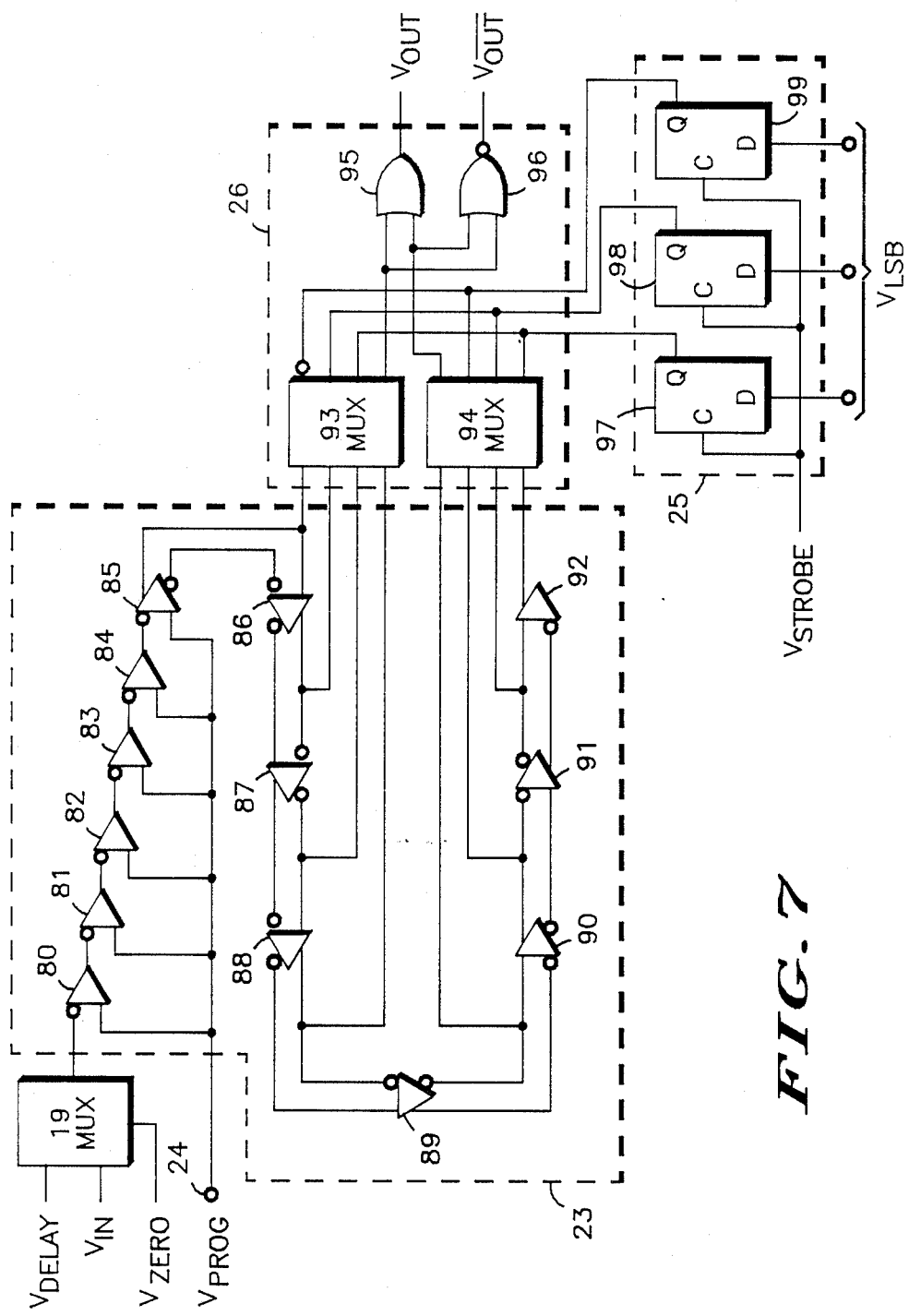
FIG. 7 is a more detailed block diagram of a third portion of FIG. 1 including two multiplexers, a second delay circuit and a second latch.

Referring to FIG. 7, multiplexer 19 has inputs coupled for receiving signals $V_{DELAY}$, $V_{IN}$, and $V_{ZERO}$. The output of multiplexer 19 is connected to the inverting input of gate 80. The inverting input of gates 81-85 are connected to the output of the preceding gate and the non-inverting inputs of gates 80-85 are coupled to terminal 24 for receiving analog signal $V_{PROG}$. Gate 86 has its inverting input and non-inverting input connected to the inverting and non-inverting outputs of gate 85, respectively. Gates 87-92 have their inverting and non-inverting inputs connecting to the non-inverting and inverting outputs, respectively, of the preceding gate. Multiplexers 93 has inputs connected to the non-inverting output of gates 85, 86, and 88 and the inverting output of gate 87. Multiplexer 94 has inputs connected to the non-inverting output of gates 90, and 92 and the inverting output of gates 89 and 91.

Flip-flops 97-99 of latch 25 have their data inputs D and clock inputs C coupled for receiving programming voltages $V_{LSB}$ and strobe signal $V_{STROBE}$, respectively, and are coupled to multiplexers 93 and 94 for selecting the desired input. OR gate 95 and NOR gate 96 ave their inputs connected to the outputs of multiplexers 93 and 94, respectively, and provide outputs $V_{OUT}$ and $V_{OUT}$, respectively.

In summary, incremental delays of 10 nanoseconds are provided by oscillator 21 and delay circuit 18. The total number of incremental delays is determined by counter 13 and comparator 14. A delay of less than 10 nanoseconds, that may be summed with these 10 nanosecond incremental delays, is provided by delay circuit 23 and multiplexer 26.

Multiplexer 19 selects either input signal $V_{IN}$ or delay signal $V_{DELAY}$ in response to signal $V_{ZERO}$, providing the selected signal to gate 80. For a desired delay of less than 10 nanoseconds, input signal $V_{IN}$ is directed through multiplexer 19 to delay circuit 23 by programming signals $V_{MSB}$ (see FIG. 4). Referring again to FIG. 7, this input signal is compared in gates 80-85 with analog signal $V_{PROG}$, providing a delay of 1.25 nanoseconds or less in increments determined by the gate delay of gates 80-85. This delayed signal may be further delayed by gates 86-92 in 1.25 nanosecond increments in accordance with programming signals $V_{LSB}$ from latch 25. The output is ORed by gates 95 and 96 to provide outputs $V_{OUT}$ and $V_{OUT}$.

For desired delays greater than 10 nanoseconds, additional increments of 10 nanoseconds may be summed with the less than 10 nanosecond delay by the remainder of the circuit (FIGS. 5 and 6). Input signal $V_{IN}$ clocks flip-flop 30, whose output Q, through OR gate 32, clocks flip-flops 35-40. Flip-flops 35-40 count in a manner known to those skilled in the art and provide output signals to exclusive OR gates 45-50. The desired output from one of exclusive OR gates 45-50 is selected by programming signals $V_{MSB}$ through flip-flops 51-56 and provided to OR gate 17. Output $V_{DONE}$ of OR gate 17 both clocks flip-flop 31 for resetting flip-flops 30 and 35-40, and for initializing delay circuit 18.

The inverting input of gate 61 of oscillator 21 receives signal $V_{ON}$ of input circuit 11. The inverting inputs of gates 62-65 are each connected to the output of the preceding gate. These inputs are compared to analog signal $V_{CALIB}$ and the results passed to multiplexers 66 and 68. This delayed signal may be further delayed by gates 86-92 in 1.25 nanosecond increments in accordance with programming signals $V_{LSB}$ from latch 25. The output is ORed by gates 95 and 96 to provide outputs $V_{OUT}$ and $V_{OUT}$.

Further embodiments of the programmable delay circuit illustrated in FIG. 1 comprises gates 61-65 of oscillator 21 of FIG. 6 and gates 80-85 in delay circuit 23 of FIG. 7. The outputs of gates 61-64 are capacitive loaded by having long metal runs on the integrated circuit for providing a fast rise time and a slow fall time so that the outputs may be compared with analog signal $V_{CALIB}$. Similarly, the outputs of multiplexer 19 and gates 80-84 are capacitive loaded by having long metal runs on the integrated circuit for providing a fast rise time and a slow fall time so that the outputs may be compared with analog signal $V_{PROG}$.

By now it should be appreciated that there has been provided a programmable delay circuit that provides a quickly adjustable and accurate delay of an input signal.

What is claimed is:

1. A monolithically integrated delay circuit comprising:

a first input terminal for receiving a digital input signal;

a second input terminal for receiving an analog input signal;

an output terminal for providing an output signal;

first means coupled to said first input terminal for providing a modified digital signal in response to said digital input signal, said modified digital signal comprising a pulse having a leading edge and a trailing edge, said leading edge and said trailing edge having a different transition time, said first means comprising:

a first voltage terminal;

a second voltage terminal;

an NPN transistor having a base coupled to said first input terminal, a collector coupled to said first voltage terminal, and an emitter;

a current source coupled between said emitter and said second voltage terminal; and second means coupled between said output terminal and both said emitter of said NPN transistor and said second input terminal for comparing said modified digital signal and said analog signal and providing an output signal at said output terminal that is delayed in time from said digital input signal.

2. The delay circuit according to claim 1 wherein said first means further comprises a capacitor coupled between said emitter and said second voltage terminal.

3. The delay circuit according to claim 1 wherein said second means comprises:

a first gate;

a last gate; and a plurality of gates coupled in series between said first gate and said last gate, said first gate having a first input coupled to said first means, each of said plurality of gates and said last gate having a first input coupled to an output of the preceding gate in series, each of said plurality of gates and said first and last gates having a second input coupled to said second input terminal, said last gate providing said output signal.

4. The delay circuit according to claim 1 wherein said second means comprises:

a first gate;

a last gate;

a plurality of gates coupled in series between said first and last gates, wherein said first gate has a first input coupled to said first means, each of said plurality of gates and said last gate having a first input coupled to an output of the preceding gate in series, each of said plurality of gates and said first and last gates having a second input coupled to said second input terminal, each of said plurality of gates having a second output; and third means having an output for providing said output signal and having a plurality of inputs, each of said plurality of inputs coupled to one of said first or second outputs of said plurality of gates, for selecting one of said inputs as said output signal.

5. The circuit according to claim 4 wherein said third means comprises:

a first multiplexer having a first input coupled to said first input terminal, a second and a third input coupled for receiving a first and a second timing calibration signal, respectively, and a plurality of outputs, each of said outputs coupled to one of said first or second outputs of said plurality of gates; and a second multiplexer having a first and a second input coupled for receiving said first and second timing calibration signal, respectively, a plurality of inputs, each input coupled to one of said outputs of said first multiplexer, and an output.

6. A monolithically integrated delay circuit comprising:

a first input terminal for receiving a digital input signal, said digital input signal comprising a pulse having a leading edge and a trailing edge, said leading edge and said trailing edge having a different transition time;

a second input terminal for receiving an analog input signal;

an output terminal;

a first gate;

a last gate; and a plurality of gates coupled in series between said first gate and said last gate, said first gate having a first input coupled to said first input terminal, each of said plurality of gates and said last gate having a first input coupled to an output of the preceding gate in series, each of said plurality of gates and saif first and last gates having a second input coupled to said second input terminal, said last gate coupled to said output terminal for providing an output signal.

7. A delay circuit comprising:

a first input terminal for receiving a digital input signal, said digital input signal comprising a pulse having a leading edge and a trailing edge, said leading edge and said trailing edge having a different transition time;

a second input terminal for receiving an analog input signal;

an output terminal;

a first gate;

a last gate;

a plurality of gates coupled in series between said first and last gates, wherein said first gate has a first input coupled to said first input terminal, eac of said plurality of gates and said last gate having a first input coupled to a first output of the preceding gate in series, each of said plurality of gates and said first and last gates having a second input coupled to said second input terminal, selected ones of said plurality of gates having a second output; and second means having an output for providing said output signal and having a plurality of inputs, each of said plurality of inputs coupled to one of said first or second outputs of said plurality of gates, for selecting one of said inputs as said output signal.

8. The circuit according to claim 7 wherein said second means comprises:

a first multiplexer having a first output coupled to said first input terminal, a first and a second input coupled for receiving a first and a second timing calibration signal, respectively, and a plurality of inputs, each of said plurality of inputs coupled to one of said first or second outputs of said plurality of gates; and a second multiplexer having a first and a second input coupled for receiving said first and second timing calibration signals, respectively, a plurality of inputs, each input coupled to one of said plurality of inputs of said first multiplexer, and an output terminal for providing said output signal.

9. A programmable delay circuit comprising:

a first input terminal for receiving a digital input signal;

a second input terminal for receiving a first analog signal;

an output terminal for providing an output signal;

first means coupled to said first input terminal for selectably delaying said digital input signal in selectable first increments for providing a first delayed signal;

second means coupled to said first means and said second input terminal for comparing said first delayed signal and said first analog signal and providing a plurality of second delayed signals that are selectively delayed in selectable second increments; and a first multiplexer coupled for receiving a first plurality of programming signals and coupled between said second means and said output terminal for receiving said second plurality of delayed signals and providing one of said second plurality of delayed signals as said output signal in response to said first plurality of programming signals.

10. The circuit according to claim 9 wherein said second means comprises:

third means coupled to said first means for comparing said first delayed signal with said first analog signal for providing a third delayed signal, said third delayed signal being delayed in relation to said first delayed signal; and fourth means coupled between said third means and said first multiplexer for providing said plurality of second delayed signals to said first multiplexer, each of said plurality of second delayed signals being further delayed in relation to said third delayed signal.

11. The circuit according to claim 10 wherein said third means comprises:

a first gate;

a second gate; and a first plurality of gates coupled in series between said first and second gates, wherein said first gate has a first input coupled to said first means for receiving said first delayed signal, each of said first plurality of gates and said second gate having a first input coupled to an output of the preceding gate in series, each of said first plurality of gates and said first and second gates having a second input coupled for receiving said first analog signal, said second gate providing said third delayed signal.

12. The circuit according to claim 11 wherein said fourth means comprises:

a third gate;

a fourth gate; and a second plurality of gates coupled in series between said third and fourth gates, wherein said third gate has an input coupled to an output of said second gate for receiving said third delayed signal, each of said second plurality of gates and said fourth gate having a first and second input coupled to a first and second output, respectively, of the preceding gate in series, said fourth gate having an output coupled to one of a plurality of inputs of said first multiplexer, one of said first or second outputs of both said third gate and said second plurality of gates each coupled separately to one of said plurality of inputs of said first multiplexer.

13. The circuit according to claim 9 further comprising:

third means coupled to said first means for comparing an initializing signal with a second analog signal for providing a first signal, said first signal being delayed in relation to said initializing signal; and fourth means coupled between said input terminal and said third means for providing said initializing signal and for counting for a selectable time period and triggering said first signal when said time period is completed.

14. The circuit according to claim 13 wherein said fourth means comprises:

fifth means coupled to said input terminal for receiving said input signal, coupled for receiving a second plurality of programming signals, coupled to said third means for providing said initializing signal and for providing a second signal representing the end of said time period selected by said second programming signals;

sixth means coupled to said fifth means for receiving said initializing signal and said second signal and coupled to said third means for providing a third signal for representing the end of said time period selected by said second programming signals; and seventh means coupled for receiving said second plurality of programming signals and coupled to said firth means, said first means and said third means for providing a fourth signal that dictates whether said first means should select said input signal or said first signal.

15. The circuit according to claim 13 wherein said fourth means comprises:

an input circuit coupled to said input terminal for receiving said input signal and coupled to said third means for providing said initializing signal;

a counter coupled to said input circuit for receiving a reset signal and a clock signal;

a first latch coupled for receiving a second plurality of programming signals;

a comparator coupled between said counter and said first latch for comparing said second plurality of programming signals with an output from said counter and providing a second signal;

a first OR gate coupled to said input signal for receiving said initializing signal and coupled to said comparator for receiving said second signal, and coupled to said third means and said input circuit for providing a third signal representing when said second plurality of programming signal compares with said output from said counter; and a second OR gate coupled to said first latch for receiving said first programming signals and coupled to said input circuit, said first means, and said third means for providing a fourth signal that dictates whether said first means should select said digital input signal or said first signal.

16. The circuit according to claim 15 wherein said third means comprises:

a first gate;

a second gate;

a first multiplexer coupled to said input circuit means for receiving said initializing signal, and coupled for receiving a first and a second timing calibration signal;

a second multiplexer coupled for receiving said first and second calibration signals; and a first plurality of gates coupled in series between said first and second gates, wherein said first gate has a first input coupled to said input circuit means for receiving said initializing signal, each of said first plurality of gates and said second gate having a first input coupled to the output of the preceding gate in series, each of saif firth plurality of gates and said first and second gates having a second input coupled for receiving said second analog signal, said first plurality of gates and said second gate having an output further coupled to both said first and second multiplexers.

17. The circuit according to claim 16 wherein said third means further comprises:

eighth means coupled to said third multiplexer for receiving the output therefrom and coupled to said first OR gate for receiving said third signal and to said second OR gate for receiving said fourth signal, for clocking said output from said third multiplexer;

a third multiplexer coupled for receiving said first and second timing calibration signals, coupled to said eighth means for receiving the output therefrom, and coupled to second means for providing said first signal;

a third gate;

an fourth gate; and a second plurality of gates coupled in series between said third and fourth gates, said third gate having an input coupled to said eighth means, each of said second plurality of gates and said fourth gate having an input coupled to the output of the preceding gate in series, the outputs of said fourth gate and selected ones of said second plurality of gates further coupled to said third multiplexer.

18. A programmable delay circuit comprising:

a first input terminal for receiving a digital input signal;

a second input terminal for receiving an analog signal;

an output terminal for providing an output signal;

first means coupled to said first input terminal for selectably delaying said digital input signal in selectable first increments for providing a first delayed signal;

second means coupled to said second input terminal and said first means for selecting one of either of said analog input signal or said first delayed signal for providing a second signal, said second signal comprising a pulse having a leading edge and a trailing edge, said leading edge and said trailing edge having a different transition time; and third means coupled between said output terminal and both said second means and said second input terminal for comparing said second signal and said analog signal and providing said output signal at said output terminal that is selectively delayed in selectable second increments.

* * * * *